US012595546B2

(12) United States Patent
Jeong et al.

(10) Patent No.: US 12,595,546 B2
(45) Date of Patent: Apr. 7, 2026

(54) METHOD FOR MANUFACTURING SILICON-COATED COPPER, SILICON-COATED ANTI-OXIDATION COPPER USING SAME, AND SEMICONDUCTOR DEVICE USING SAME

(71) Applicant: PUSAN NATIONAL UNIVERSITY INDUSTRY-UNIVERSITY COOPERATION FOUNDATION, Busan (KR)

(72) Inventors: Se Young Jeong, Busan (KR); Su Jae Kim, Busan (KR)

(73) Assignee: PUSAN NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 221 days.

(21) Appl. No.: 18/561,672

(22) PCT Filed: May 12, 2022

(86) PCT No.: PCT/KR2022/006804
§ 371 (c)(1),
(2) Date: Nov. 16, 2023

(87) PCT Pub. No.: WO2022/250343
PCT Pub. Date: Dec. 1, 2022

(65) Prior Publication Data
US 2024/0250049 A1     Jul. 25, 2024

(30) Foreign Application Priority Data

May 28, 2021     (KR) ........................ 10-2021-0069338

(51) Int. Cl.
*C23C 14/16*          (2006.01)
*C23C 14/08*          (2006.01)
(Continued)

(52) U.S. Cl.
CPC ............ *C23C 14/165* (2013.01); *C23C 14/08* (2013.01); *C30B 23/025* (2013.01); *C30B 29/06* (2013.01);
(Continued)

(58) Field of Classification Search
CPC ... C23C 14/0015; C23C 14/08; C23C 14/165; C23C 14/34; C23C 14/06;
(Continued)

(56) References Cited

U.S. PATENT DOCUMENTS

2005/0260860 A1    11/2005  Lee
2006/0121734 A1     6/2006  Higashi et al.
(Continued)

FOREIGN PATENT DOCUMENTS

JP        S63-299250 A     12/1988
JP        2006-165115 A     6/2006
(Continued)

OTHER PUBLICATIONS

Korean Notice of Allowance for related KR Application No. 10-2021-0069338 mailed Feb. 19, 2024 from Korean Intellectual Property Office.
(Continued)

*Primary Examiner* — Lawrence D Ferguson
(74) *Attorney, Agent, or Firm* — Paratus Law Group, PLLC

(57)                ABSTRACT

A silicon-coated oxidation-resistant copper includes a SiCuO$_x$ layer includes a silicon (Si)-oxygen (O)-copper (Cu) mixed layer formed by depositing silicon (Si). The silicon-coated oxidation-resistant copper includes: a copper layer; the SiCuO$_x$ layer including the silicon (Si)-oxygen (O)-copper (Cu) mixed layer formed on the copper layer; a first silicon (Si)-oxygen (O) mixed layer formed on the SiCuO$_x$ layer; a silicon (Si) layer formed on the first silicon (Si)-
(Continued)

oxygen (O) mixed layer; and a second silicon (Si)-oxygen (O) mixed layer formed on the silicon layer (Si) layer.

10 Claims, 13 Drawing Sheets

(51) Int. Cl.

| | |
|---|---|
| *C30B 23/02* | (2006.01) |
| *C30B 29/06* | (2006.01) |
| *C30B 29/22* | (2006.01) |
| *H10W 72/00* | (2026.01) |
| *H10W 72/90* | (2026.01) |

(52) U.S. Cl.
CPC ....... *C30B 29/22* (2013.01); *H10W 72/01938* (2026.01); *H10W 72/952* (2026.01); *H10W 72/953* (2026.01)

(58) Field of Classification Search
CPC ... C23C 14/5806; C30B 23/025; C30B 29/06; C30B 29/22; H01L 2224/0345; H01L 2224/05647; H01L 2224/05686; H01L 24/03; H01L 24/05; H01L 2924/0549; H01L 2224/45147; H01L 2224/454; H01L 24/44
See application file for complete search history.

(56) References Cited

U.S. PATENT DOCUMENTS

| | | | |
|---|---|---|---|
| 2010/0084626 A1 | 4/2010 | Delhougne et al. | |
| 2014/0311900 A1 | 10/2014 | Yuan et al. | |
| 2017/0032975 A1 | 2/2017 | Tai et al. | |
| 2018/0151268 A1 | 5/2018 | Matsuura | |

FOREIGN PATENT DOCUMENTS

| | | | |
|---|---|---|---|
| KR | 10-2007-0045269 A | 5/2007 | |
| KR | 10-0863388 B1 | 10/2008 | |
| KR | 10-2017-0046147 A | 4/2017 | |
| KR | 10-2017-0116129 A | 10/2017 | |
| KR | 10-2018-0120607 A | 11/2018 | |
| WO | WO 2016/174970 A1 | 11/2016 | |
| WO | WO 2022250343 A1 * | 1/2022 | |

OTHER PUBLICATIONS

International Search Report for PCT/KR2022/006804 mailed Aug. 17, 2022 from Korean Intellectual Property Office.

Korean Office Action for related KR Application No. 10-2021-0069338 mailed Mar. 10, 2023 from Korean Intellectual Property Office.

Cho, Myeong-Ui, "Successful synthesis of large-area 4-layer single crystal graphene", Techworld Online News, Jul. 29, 2020, https://www.epnc.co.kr/news/articleView.html?idxno=100919.

Chinese Office Action for related CN Application No. 202280030045.6 mailed Jul. 17, 2025 from China National Intellectual Property Administration.

Japanese Office Action for related JP Application No. 2023-572159 mailed Oct. 29, 2024 from Japan Patent Office.

Japanese Office Action for related JP Application No. 2023-572159 mailed Apr. 1, 2025 from Japan Patent Office.

Japanese Notice of Allowance for related JP Application No. 2023-572159 mailed Jul. 8, 2025 from Japan Patent Office.

* cited by examiner

Cu  Copper

Si  silicon

O  oxygen

1

METHOD FOR MANUFACTURING SILICON-COATED COPPER, SILICON-COATED ANTI-OXIDATION COPPER USING SAME, AND SEMICONDUCTOR DEVICE USING SAME

CROSS-REFERENCE TO PRIOR APPLICATIONS

This application is a National Stage Patent Application of PCT International Application No. PCT/KR2022/006804 (filed on May 12, 2022), which claims priority to Korean Patent Application No. 10-2021-0069338 (filed on May 28, 2021), which are all hereby incorporated by reference in their entirety.

BACKGROUND

The present invention relates to a method for producing a silicon-coated copper, a silicon-coated oxidation-resistant copper produced using the same, and a semiconductor device including the same, and more specifically, to a copper including a silicon (Si)-coated surface, which is produced by forming a protective layer including a silicon (Si)-oxide (O)-copper (Cu) mixed layer by deposition of silicon (Si) and has resistance to oxidation while retaining the electrical properties of copper.

In general, copper is highly useful as a conductive material and is widely used. This copper is used as a thin film, foil, or bulk structure. However, since copper has low resistance to oxidation, it cannot be used in the case where extreme reliability is required, or the case where long-term use is required, or the case where a high-temperature environment is required, and gold, which has higher resistance and is more expensive than copper, is used in this case.

Therefore, for the more efficient use of copper which is economically advantageous and has excellent physical properties, a technology to solve this oxidation problem is needed.

SUMMARY

The present invention has been made in order to solve the above-described problems, and an object of the present invention is to provide a method of producing a copper thin film, foil, or bulk structure, which is prevented from oxidation and, at the same time, is stable against oxidation even at high temperatures, by forming a protective layer composed of Si—O—Cu through deposition of silicon (Si).

Objects to be achieved by the present invention are not limited to the objects mentioned above, and other objects not mentioned herein will be clearly understood by those skilled in the art to which the present invention pertains from the following description.

The present invention provides a silicon-coated oxidation-resistant copper including silicon (Si)-oxygen (O) and silicon (Si)-oxygen (O)-copper (Cu) mixed layers formed by deposition of silicon.

In addition, the silicon-coated copper may have an electrical resistivity between that of non-silicon-coated copper and that of gold (Au).

In addition, the silicon-coated copper may have an electrical resistivity of $1.68*10^{-6}$ to $2.2*10^{-6}$ $\Omega \cdot cm$.

In addition, the silicon-coated copper may include:

a copper layer 10;

a $SiCuO_x$ layer 20 formed of a silicon (Si)-oxygen (O)-copper (Cu) mixture on the copper layer 10;

2 a first silicon (Si)-oxygen (O) mixed layer 30 formed on the $SiCuO_x$ layer 20;

a silicon (Si) layer 40 formed on the first silicon (Si)-oxygen (O) mixed layer 30; and a second silicon (Si)-oxygen (O) mixed layer 50 formed on the silicon layer (Si) layer 40.

In addition, the silicon (Si) layer 40 may have a thickness of 3 to 20 nm.

In addition, the first silicon (Si)-oxygen (O) mixed layer 30 and the second silicon (Si)-oxygen (O) mixed layer 50 may have a thickness of 1 to 10 nm.

In addition, the $SiCuO_x$ layer 20 may have a thickness of 0.8 to 1.2 nm.

The present invention also provides a method for producing a silicon-coated copper, the method including depositing silicon (Si) on copper (Cu) by a single sputtering process.

In addition, the sputtering may be performed under an argon atmosphere.

In addition, the sputtering may be performed at room temperature to 350° C. for 1 to 5 minutes.

The present invention also provides a semiconductor device including a copper on which a $SiCuO_x$ layer 20 composed of a silicon (Si)-oxygen (O)-copper (Cu) mixture has been formed by depositing silicon (Si).

In addition, the $SiCuO_x$ layer may have a thickness of 0.8 to 1.2 nm.

According to the above-described technical solution of the present invention, it is possible to produce a copper free from oxidation with high efficiency simply by deposition of silicon (Si), and it is possible to replace gold with copper (Cu) and silicon (Si), which are the most abundant on earth. Therefore, the present invention is economically highly valuable.

In addition, according to the present invention, it is possible to produce a copper (Cu), which has resistance to oxidation while retaining the electrical properties of copper, by forming a protective layer composed of silicon (Si)-oxygen (O)-copper (Cu) through deposition of silicon (Si).

In addition, according to the present invention, it is possible to provide an oxidation-resistant copper, which is produced in a very simple manner, is inexpensive, and may be used semi-permanently at room temperature.

In addition, when pattern fabrication and surface treatment are performed according to the present invention, it is possible to fabricate a circuit that does not oxidize despite heat generation, thereby preventing fire and explosion from occurring due to heat generation.

BRIEF DESCRIPTION OF THE DRAWINGS

FIG. 4 shows the XRD measurement results of a silicon (Si)-coated single-crystal copper thin film. From these results, it can be seen that the crystal structure did not change at all even after heat treatment in air at 350° C. for 30 minutes, crystallization in one direction occurred more easily, and the surface was not oxidized.

DETAILED DESCRIPTION

The terms used in this specification will be briefly explained, and the present invention will be described in detail.

The terms used in the present invention are currently widely used general terms selected in consideration of their functions in the present invention, but they may change depending on the intents of those skilled in the art, precedents, or the advents of new technology. Accordingly, the terms used in the present invention should be defined based on the meaning of the term and the entire contents of the present invention, rather than the simple term name.

Throughout the present specification, it is to be understood that when any part is referred to as "including" any component, it does not exclude other components, but may further include other components, unless otherwise specified.

Embodiments of the present invention will be described below in detail with reference to the accompanying drawings so that those skilled in the art can easily carry out the present invention. However, the present invention may be embodied in various different forms and is not limited to the embodiments described herein.

Specific details on the present invention, including the Technical Problem, the Technical Solution, the Advantageous Effects, are included in the embodiments to be described below and the accompanying drawings. The advantages and features of the present invention, and the way of attaining them, will become apparent with reference to the embodiments described below in conjunction with the accompanying drawings.

Hereinafter, the present invention will be described in more detail with reference to the accompanying drawings.

The present invention is directed to a method for producing a silicon-coated copper, the method including forming a silicon (Si)-oxygen (O)-copper (Cu) mixed layer by depositing silicon.

More specifically, the copper surface is coated with silicon by depositing silicon by a single sputtering process. The sputtering is preferably performed under an argon atmosphere at room temperature to 350° C. for 1 to 5 minutes. If the temperature and time of the sputtering are out of the above ranges, crystallinity will decrease due to the formation of grain boundaries and dislocations. For this reason, the sputtering is preferably performed at a temperature within the above temperature range. In Examples of the present invention, the sputtering was at 190° C. for 75 seconds, 150 seconds, or 300 seconds.

The silicon-coated copper produced by the method for producing a silicon-coated copper may include a SiCuO$_x$ layer 20 including a silicon (Si)-oxygen (O)-copper (Cu) mixed layer formed by depositing silicon.

Figure 1:
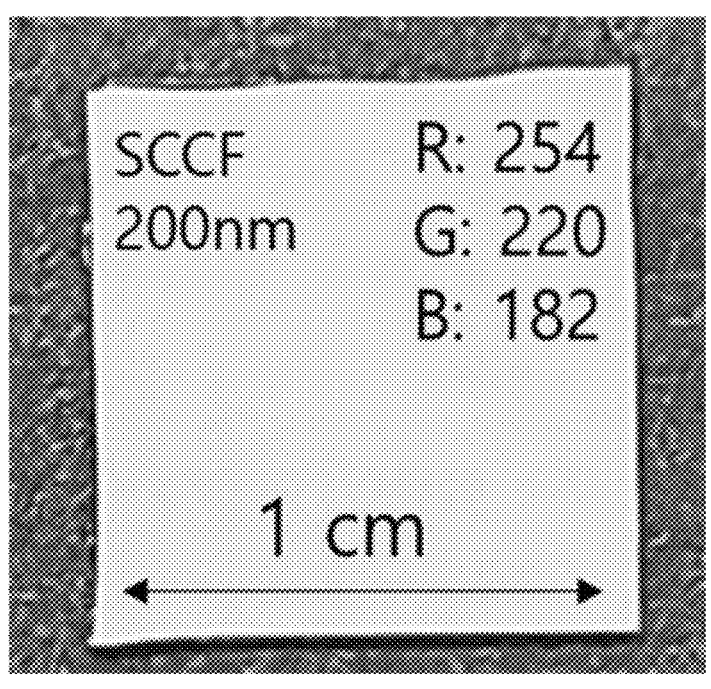
FIG. 1 is a photograph of a single-crystal copper thin film which shows brighter RGB values (R: 254, G: 220, and B: 182) than the known RGB values of copper (R: 184, G: 115, and B: 51).
Figure 2:
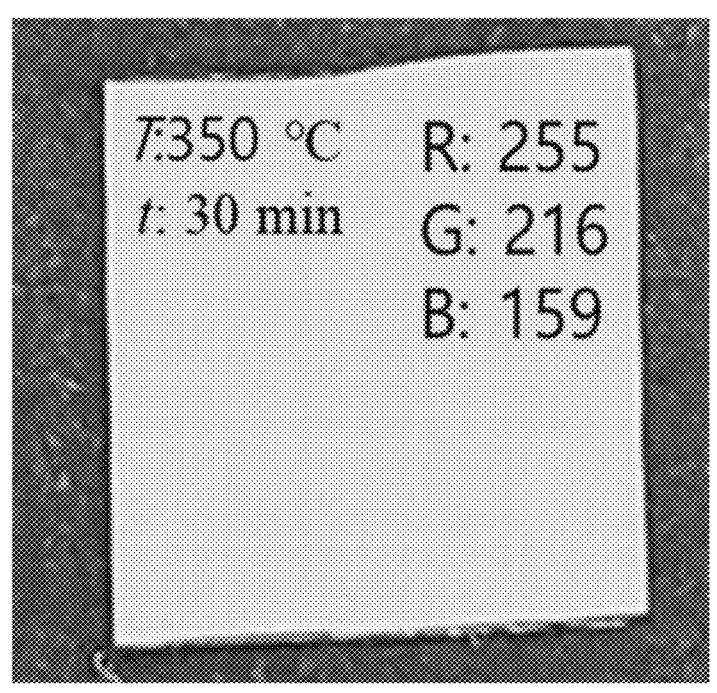
FIG. 2 is a photograph of a silicon (Si)-coated single-crystal copper thin film heat-treated in air at 350° C. for 30 minutes after coating with silicon (Si).

The silicon-coated copper of the present invention may have RGB values of 250 to 260 (red), 210 to 220 (green), and 155 to 165 (blue), respectively. FIG. 1 is a photograph of a 185-nm-thick single-crystal copper thin film (SCCF), and FIG. 2 is a photograph of a copper coated with silicon and then heat-treated in air at 350° C. for 30 minutes. When produced to have the same size, the single-crystal thin film copper in FIG. 1 had RGB values of 254 (red), 220 (green), and 182 (blue), and the copper in FIG. 2 according to the present invention, which was coated with silicon and then heat-treated in air, were observed to have RGB values of 255 (red), 216 (green), and 159 (blue). Considering that the known RGB values of copper are 185 (red), 115 (green), and 51 (blue), it can be seen that the silicon-coated copper produced according to the present invention is prevented from oxidation, and remains similar to the single-crystal thin film copper even when heat-treated at 350° C. for 30 minutes, indicating that it is prevented from oxidation.

FIGS. 5 to 8 are photographs showing a comparison of a copper foil and a silicon-coated copper foil between before and after heat treatment in air. As a result of comparing the copper foil between before heat treatment (FIG. 5) and after heat treatment at 250° ° C. for 30 minutes (FIG. 7), it can be seen that the copper foil turned dark. On the other hand, as a result of comparing the silicon-coated copper foil between before heat treatment (FIG. 6) and after heat treatment at 250° ° C. for 30 minutes (FIG. 8), it can be seen that the silicon-coated copper foil retained its original color.

Figure 3:
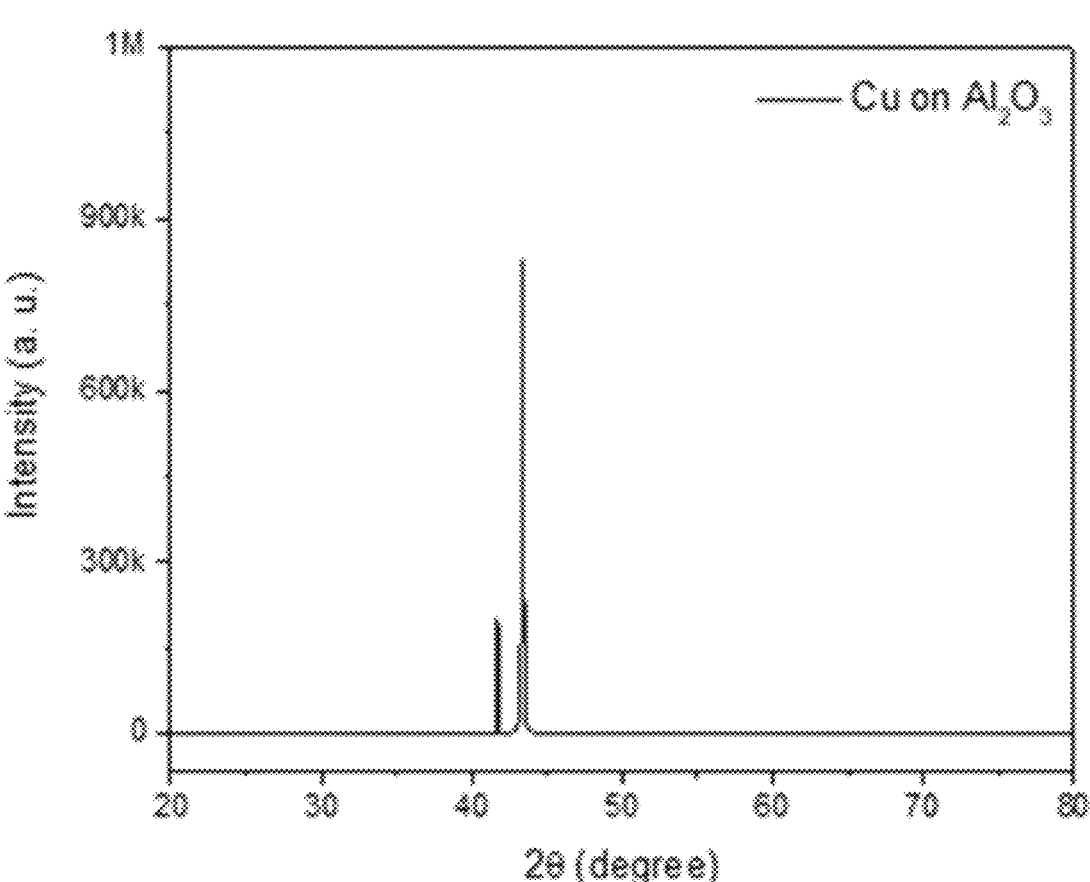
FIG. 3 shows the XRD measurement results of a single-crystal copper thin film.
Figure 4:
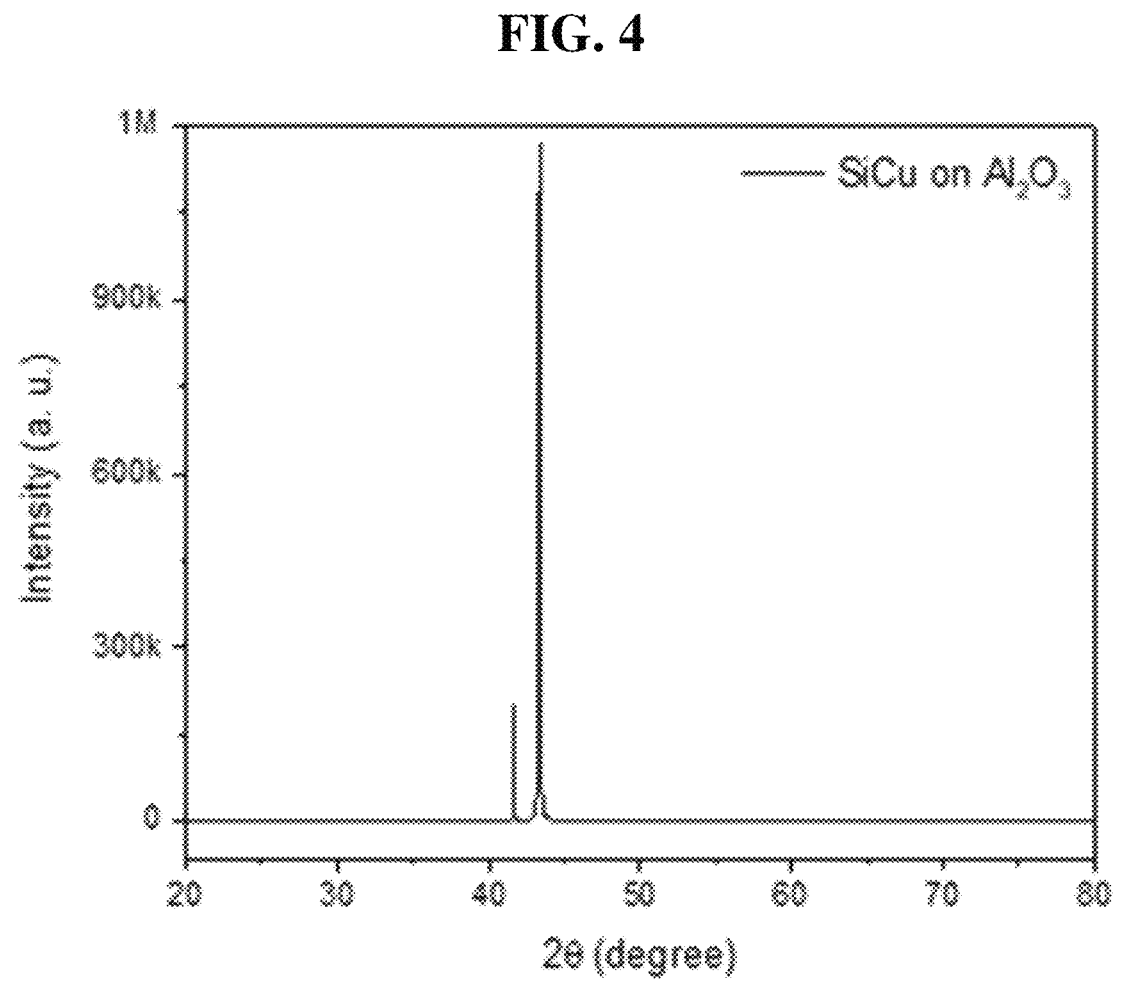
Figure 5:
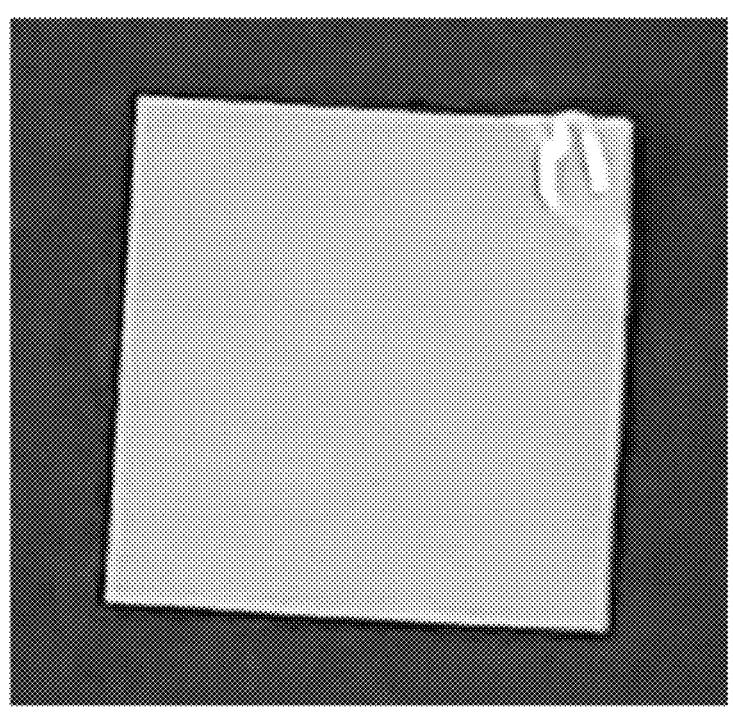
FIG. 5 is a photograph of a conventional copper foil.
Figure 6:
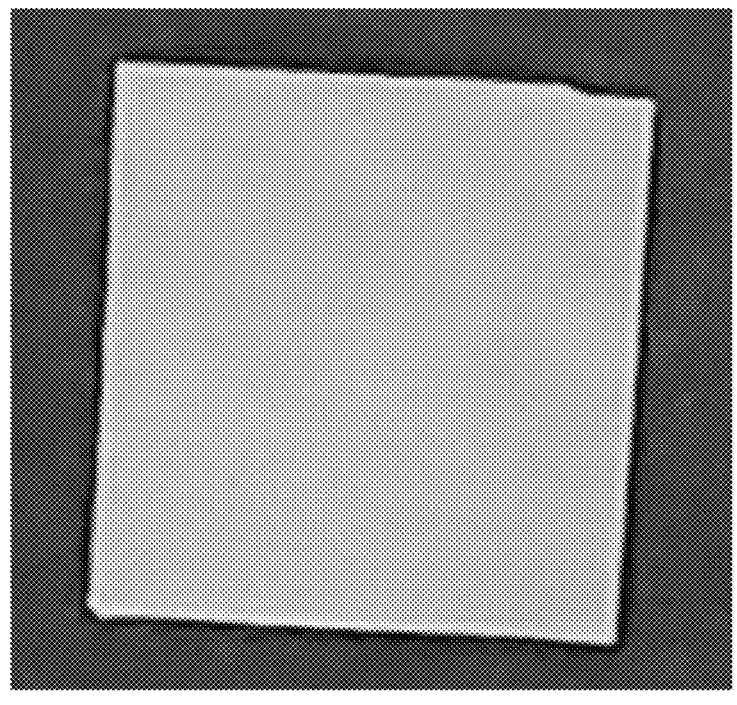
FIG. 6 is a photograph of a copper foil surface-treated by coating with silicon (Si).
Figure 7:
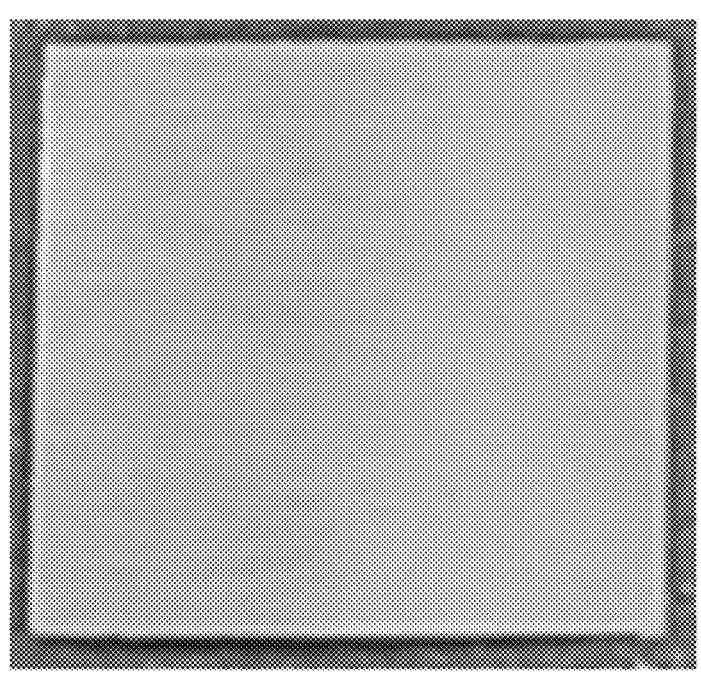
FIG. 7 is a photograph of a conventional copper foil heat-treated in air at 250° C. for 30 minutes.
Figure 8:
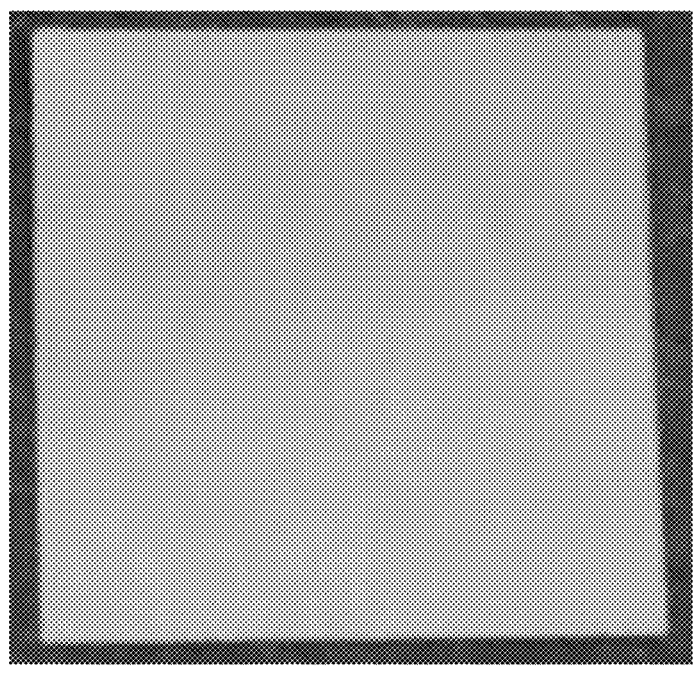
FIG. 8 is a photograph of a copper foil surface-treated by coating with silicon (Si) and then heat-treated in air at 250° C. for 30 minutes.

FIGS. 3 and 4 show the XRD measurement results of a single-crystal thin copper film (SCCF) and a single-crystal copper thin film coated with silicon and then heat treated. As shown in FIG. 4, it can be seen that, even after coating with silicon and then heat treatment at 350° C. in air for 30 minutes, the crystal structure of the silicon-coated single-crystal copper thin film did not change at all, crystallization in one direction occurred more easily, and the surface was not oxidized.

Figure 9:
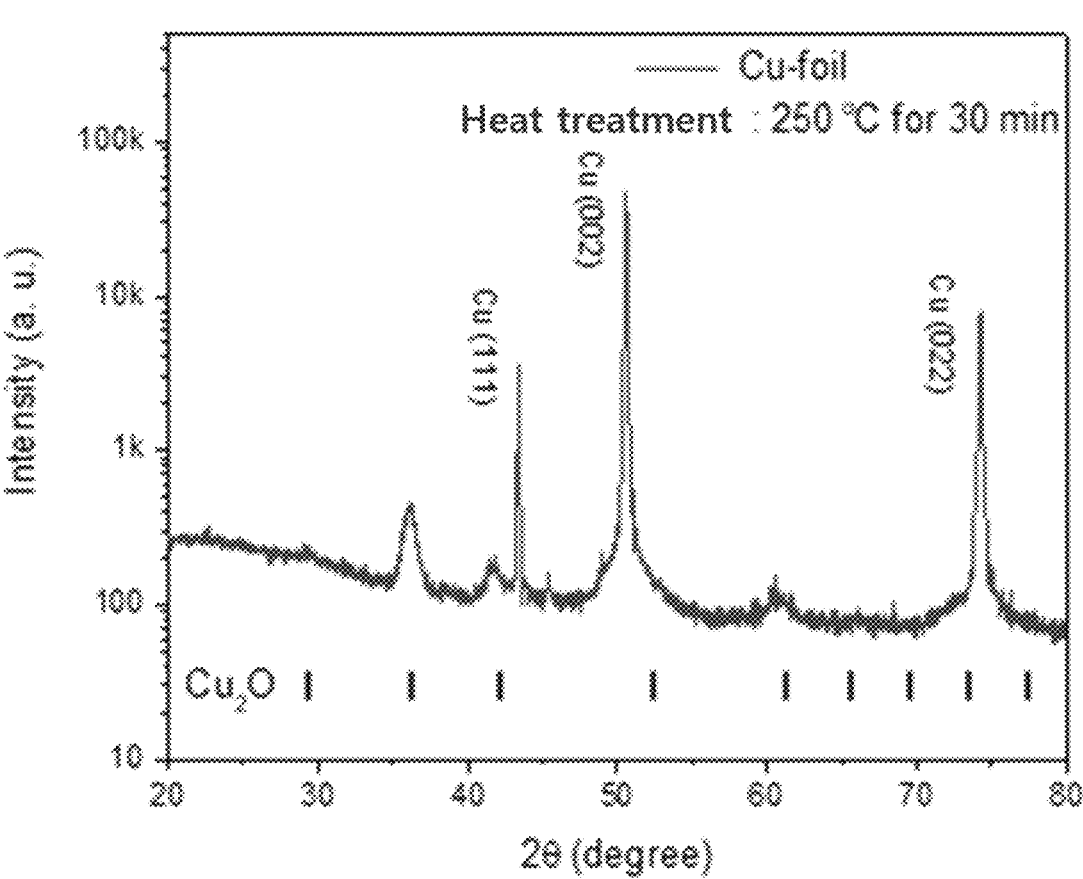
FIG. 9 shows the XRD measurement results of a conventional copper foil heat-treated in air at 250° C. for 30 minutes.
Figure 10:
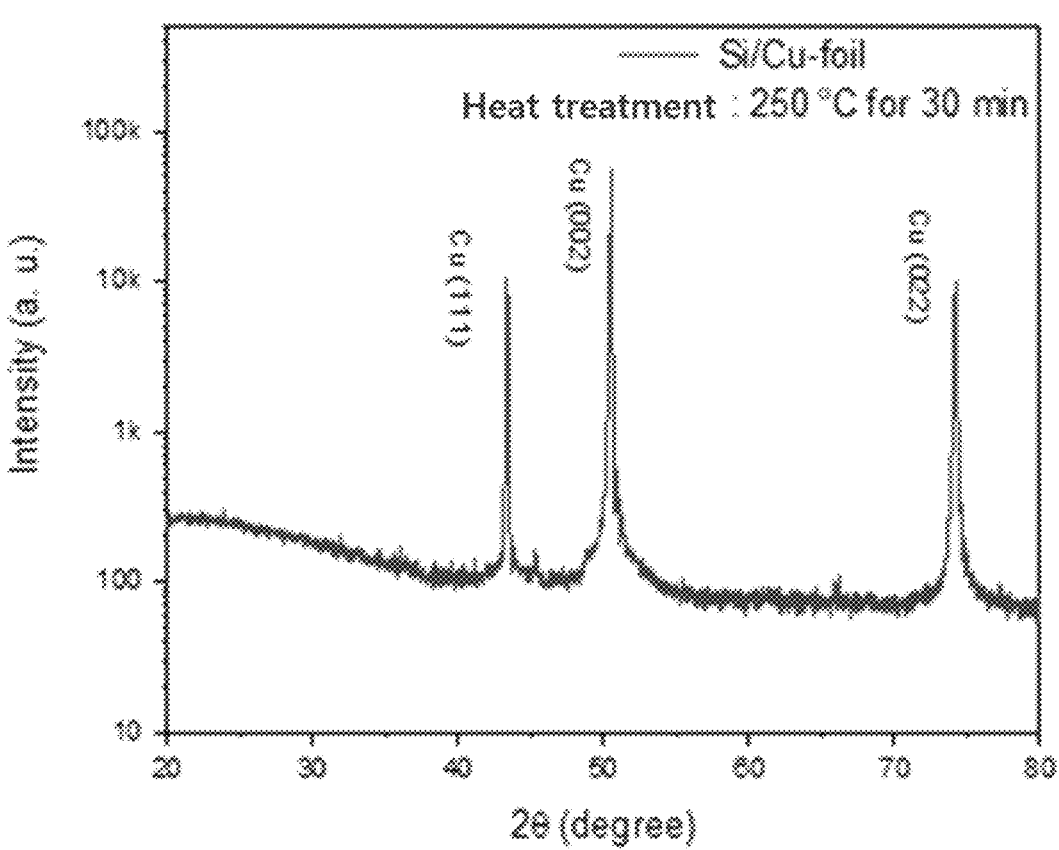
FIG. 10 shows the XRD measurement results of a copper foil surface-treated by coating with silicon (Si) and then heat-treated in air at 250° ° C. for 30 minutes.

FIGS. 9 to 10 show the XRD measurement results of a copper foil and a silicon-coated copper foil after heat treatment in air. As a result of comparing the copper foil of FIG. 9 with the silicon-coated copper foil of FIG. 10 after heat treatment in air 250° C. for 30 minutes, it can be seen that the copper foil showed a Cu$_2$O phase as shown in FIG. 9, the silicon-coated copper foil retained its original copper structure as shown in in FIG. 10.

Figure 11:
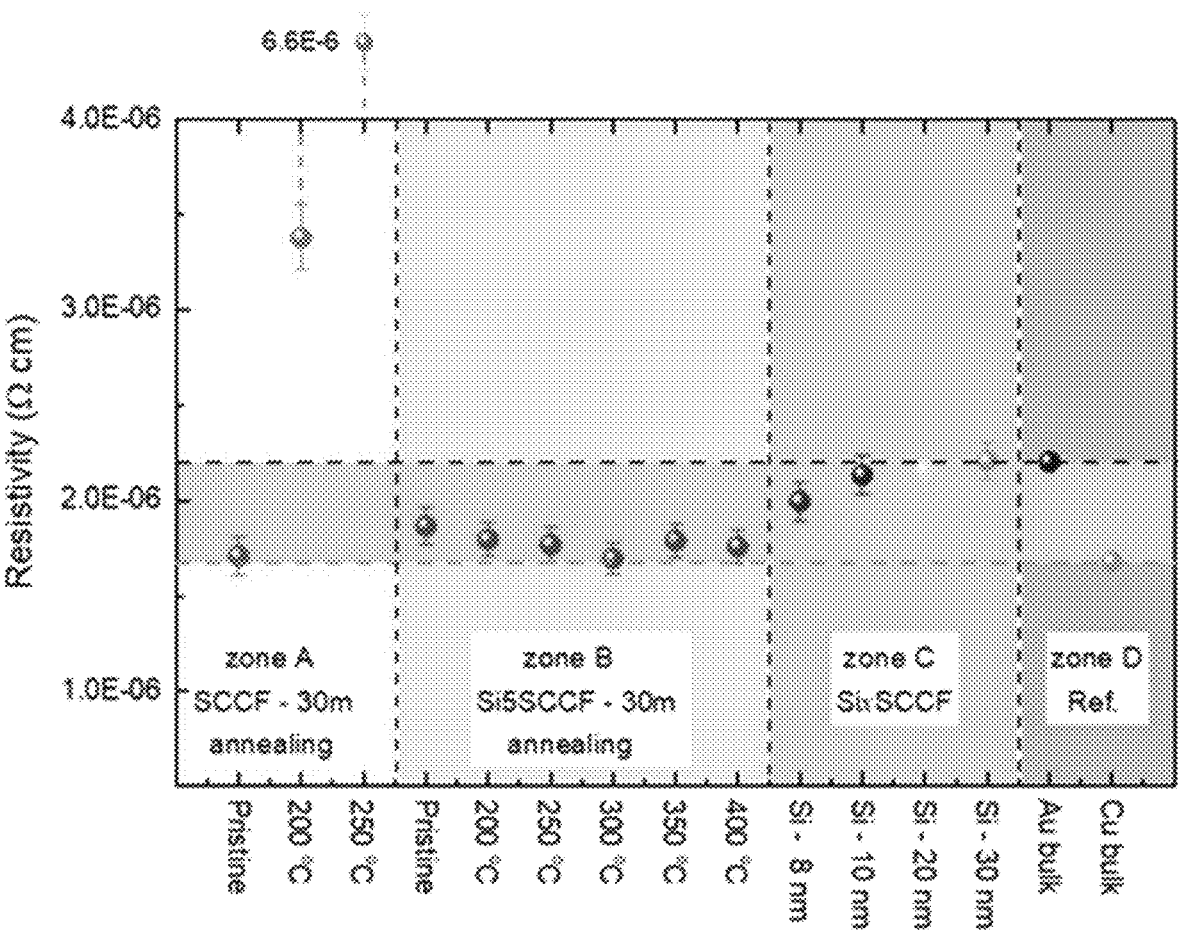
FIG. 11 is a graph showing changes in electrical resistivity of a SiCu/Al$_2$O$_3$ specimen depending on the heat treatment temperature and silicon (Si) coating thickness thereof.

In addition, as shown in FIG. 11, the silicon-coated copper of the present invention may have a resistivity of 1.68*10$^{-6}$ $_2$·cm, which is the resistivity of bulk Cu, and 2.2*10$^{-6}$ Ω·cm, which is the resistivity of bulk Au.

The silicon-coated copper of the present invention has an electrical resistivity similar to that of non-silicon-coated copper.

The silicon-coated copper of the present invention is prevented from oxidation even when heated at 200° ° C. for 60 hours.

FIG. 11 is a graph showing changes in electrical resistivity of a SiCu/Al$_2$O$_3$ specimen depending on the heat treatment temperature and silicon coating thickness thereof. In FIG. 11, zone A shows the change in resistivity of a 185-nm-thick single-crystal thin copper thin film (SCCF) specimen by heat treatment, and zone B shows the change in resistivity of a silicon-coated single-crystal thin copper thin film (SCCF) specimen (Si5SCCF) by heat treatment. Zone C shows the change in resistivity of a single-crystal thin copper film (SCCF) specimen coated with silicon thicker than 5 nm. Zone D shows the resistivities of bulk Cu and bulk Au, compared to zones B and C.

In zone A, the pristine SCCF specimen has a resistivity which is almost the same as 1.68*10$^{-6}$ Ω·cm, which is the resistivity of bulk Cu, and it has a resistivity lower than 2.2*10$^{-6}$ Ω·cm, which is the resistivity of bulk Au. However, in zone A, it can be seen that, when a single-crystal thin copper film (SCCF) specimen is heat-treated at 200 to 250° C., the resistivity thereof increases rapidly. This means that copper is oxidized into Cu$_2$O.

Meanwhile, in zone B, it can be seen that a specimen (Si5SCCF) obtained by coating a 185-nm-thick single-crystal thin copper film (SCCF) with 5 nm of silicon has a resistivity similar to that of bulk Cu even when heat-treated at 400° ° C. for 30 minutes.

In addition, zone C shows that the resistivity changes as the thickness of the silicon layer increases. It can be seen that the single-crystal thin copper film (SCCF) coated with silicon has a resistivity between the resistivity of bulk Cu and the resistivity of bulk Au before the thickness of the silicon layer reaches 30 nm, and has a resistivity similar to that of bulk Au only after the thickness of the silicon layer reaches 30 nm.

The silicon-coated copper may be produced in a single-crystal thin film, polycrystalline thin film, foil, or bulk form. As shown in FIG. 11, when the silicon-coated copper is a single-crystal thin film, it is prevented from oxidation even when heated at 400° ° C. for 30 minutes. When the silicon-coated copper is a polycrystalline thin film, foil, or bulk, it is prevented from oxidation even when heated at 300° ° C. for 30 minutes.

Figure 12:
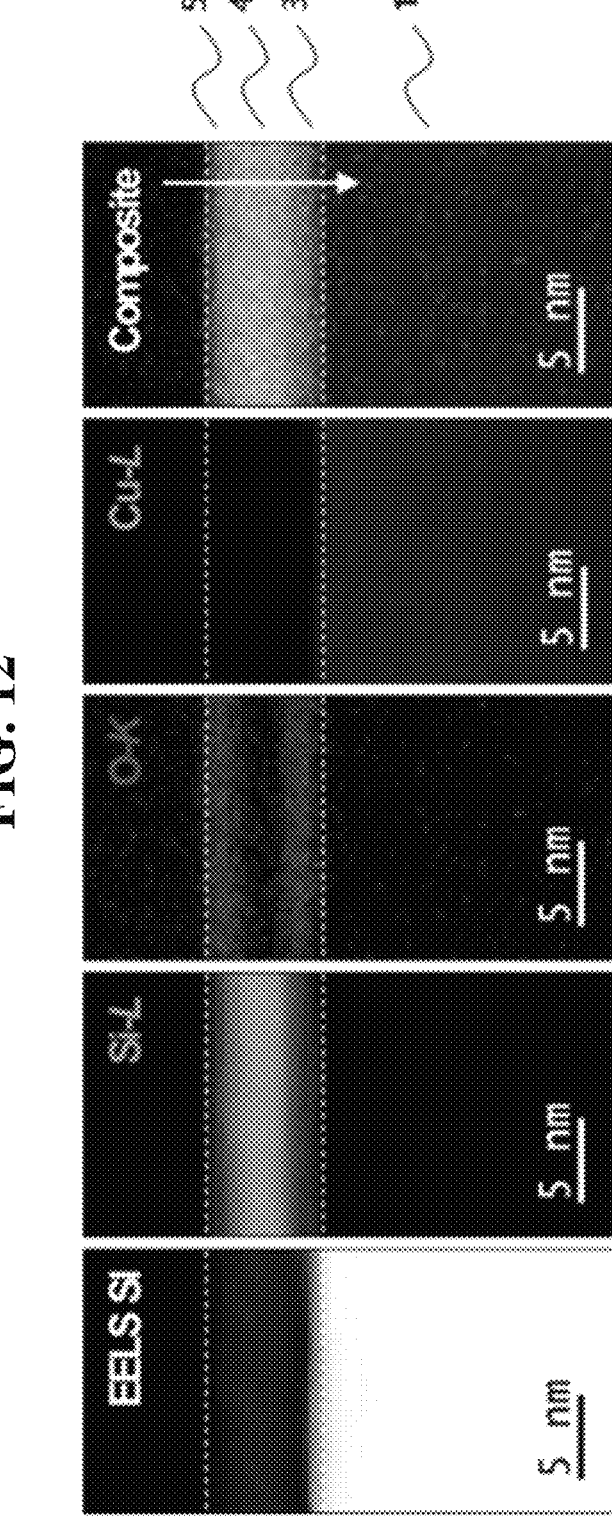
FIG. 12 shows the TEM measurement results of the cross-section of a Si10Cu/Al$_2$O$_3$ specimen.

As shown in FIG. 12, the silicon-coated copper produced by the method for producing a silicon-coated copper includes: a copper layer 10; a SiCuO$_x$ layer 20 formed of a silicon (Si)-oxygen (O)-copper (Cu) mixture on the copper layer 10; a first silicon (Si)-oxygen (O) mixed layer 30 formed on the SiCuO$_x$ layer 20; a silicon (Si) layer 40 formed on the first silicon (Si)-oxygen (O) mixed layer 30; and a second silicon (Si)-oxygen (O) mixed layer 50 formed on the silicon layer (Si) layer 40.

FIG. 12 shows the TEM measurement results of the cross-section of a Si10Cu/Al$_2$O$_3$ specimen obtained by coating a single-crystal copper thin film with 10 nm of silicon. As can be seen therein, in the present invention, the coated silicon does not simply exist as a single layer, but a silicon (Si)-oxygen (O) mixed layer is formed on the copper layer 10, and a silicon (Si) layer and a silicon (Si)-oxygen (O) mixed layer are sequentially formed thereon.

More specifically, the first silicon (Si)-oxygen (O) mixed layer 30, the silicon (Si) layer 40, and the second silicon (Si)-oxygen (O) mixed layer 50, which are layers formed by coating copper with silicon (Si), may have a thickness of 5 to 30 nm. If these silicon (Si)-coated layers are thinner than 5 nm, a problem may arise in that the copper is easily oxidized, and if these layers are thicker than 30 nm, a problem may arise in that the copper becomes dielectric or has poor electrical conductivity. For this reason, these layers have a thickness within the above-described range.

The silicon (Si) layer 40 may have a thickness of 3 to 20 nm.

The first silicon (Si)-oxygen (O) mixed layer 30 and the second silicon (Si)-oxygen (O) mixed layer 50 may have a thickness of 1 to 10 nm.

The SiCuO$_x$ layer may have a thickness of 0.8 to 1.2 nm.

Figure 13:
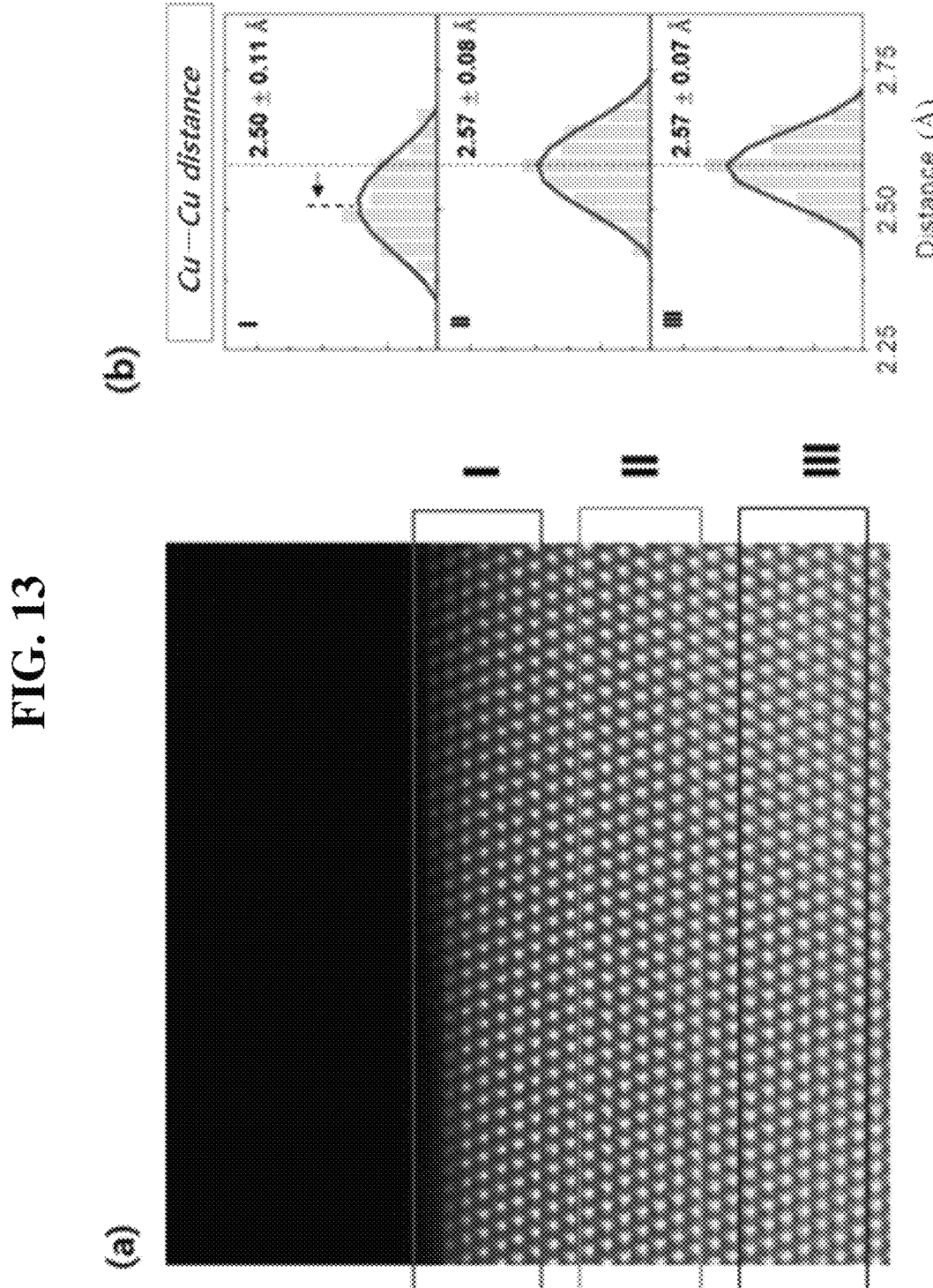
FIG. 13 shows the results of observing the change in distance between copper atoms depending on depth of Si10Cu/Al$_2$O$_3$ by high-resolution TEM.

FIG. 13 shows the results of observing the change in distance between copper atoms depending on depth by high-resolution TEM. As shown in FIG. 13, it can be seen that the distance between copper (Cu) atoms on the surface has decreased, which means that a mixed layer of silicon (Si) and copper (Cu) exists on the surface. The presence of this mixed layer of silicon (Si) and copper (Cu) can be confirmed again by the XPS analysis shown in FIG. 14.

Figure 14:
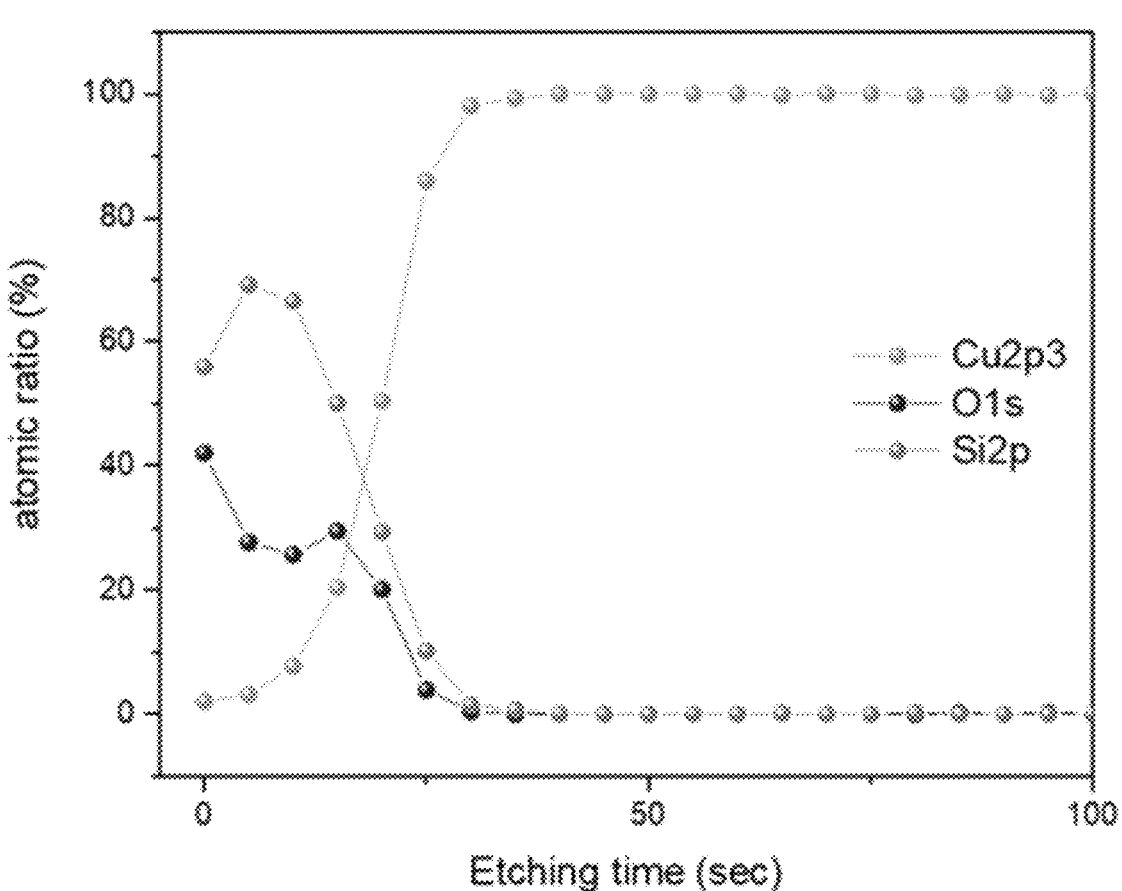
FIG. 14 shows the results of XPS analysis of the Si10SCCF specimen surface.

FIG. 14 shows the results of XPS analysis performed to examine the distribution of components on the surface of the SCCF (Si10SCCF) specimen coated with 10 nm of silicon. It can be seen that the oxygen on the surface decreases slightly, increases again in the mixed layer, and then decreases, and the distribution of silicon (Si) is the highest in the portion where oxygen forms the valley. Additionally, there is a portion where oxygen, silicon, and copper form a mixed layer, and this mixed layer is expected to play a critical role in preventing oxidation. That is, it can be seen that, on the copper surface, the silicon (Si)-oxygen (O)-copper (Cu) mixed layer 20 (SiCuO$_x$ layer), the silicon (Si)-oxygen (O) mixed layer (SiO$_x$), and the silicon (Si) layer 40 are sequentially formed.

Figure 15:
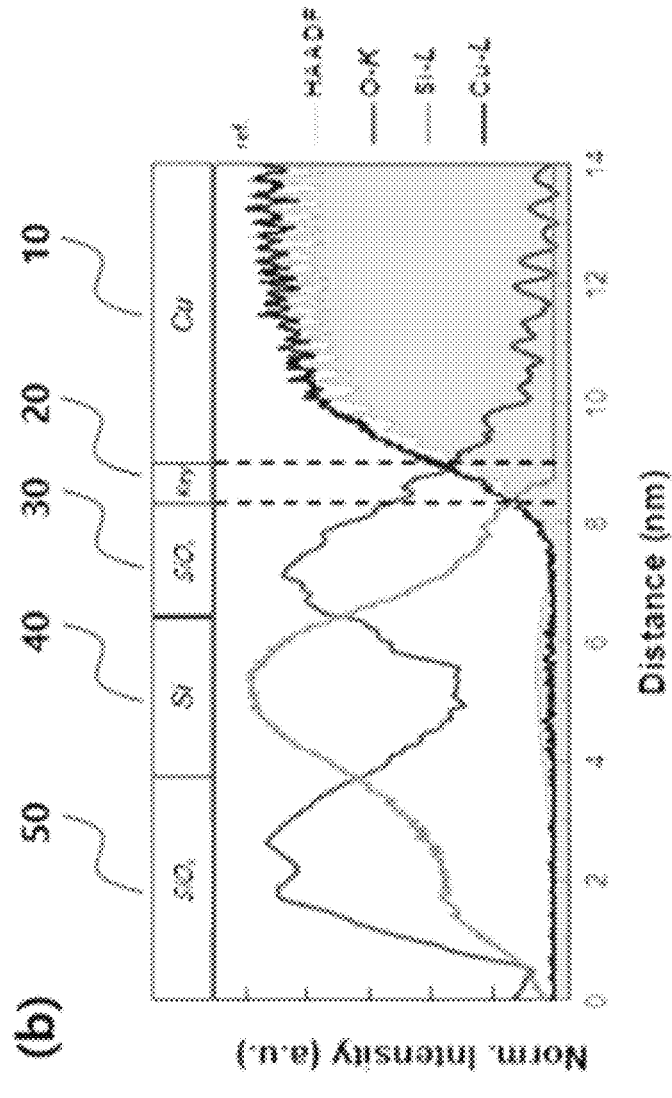
FIG. 15 shows the results of TEM analysis of the components of the Si10SCCF specimen surface.
Figure 15:
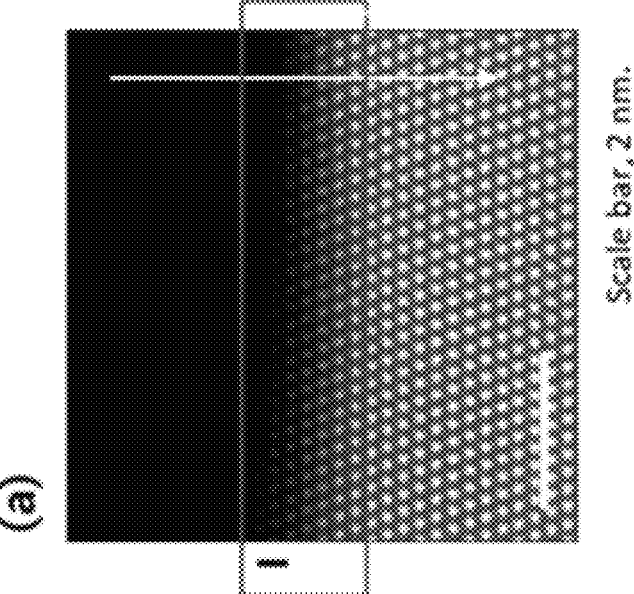

FIG. 15 shows the surface structure (TEM) of the surface of the SCCF (Si10SCCF) specimen coated with 10 nm of silicon, from which shows the surface morphology of the silicon-coated copper can be confirmed more accurately. FIG. 15(*b*) shows the results of TEM analysis of components. As shown in the TEM measurement results in FIG. 12 and the XPS measurement results in FIG. 14, FIG. 15(*b*) shows that the silicon (Si)-oxygen (O)-copper (Cu) mixed layer 20 (SiCuO$_x$ layer), the silicon (Si)-oxygen (O) mixed layer (SiO$_x$), and the silicon (Si) layer 40 are sequentially formed on the copper (Cu) surface. Because the formed silicon (Si)-oxygen (O) mixed layer (SiO$_x$) has an amorphous structure, it is not visible in the image of FIG. 15(*a*). Silicon atoms immediately above the copper thin film function to fix oxygen atoms, which move freely on the copper surface, at optimal sites. In general, oxygen atoms move relatively freely on the flat surface of copper, but silicon functions to fix these oxygen atoms. The thickness of the silicon (Si) layer 40 is not critical to preventing oxidation, and the most important structure is determined by 1 or 2 layers of atoms immediately above the copper thin film.

In the portion indicated by "key" in FIG. 15(*b*), the silicon (Si)-oxygen (O)-copper (Cu) mixed layer 20 (SiCuO$_x$ layer) including a mixture of oxygen, silicon and copper is present, and it is expected that this mixed layer plays a critical role in preventing oxidation.

Figure 16:
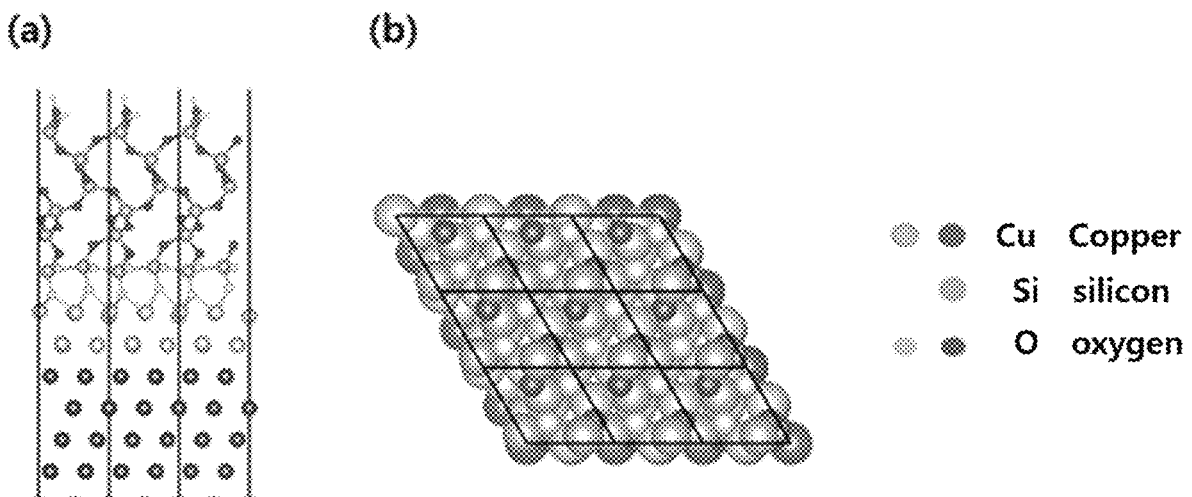
FIG. 16 shows the expected distribution of O (pink and red) and Si (yellow) on a copper thin film (from green to bottom). (a): a side view, (b): a top view.

FIG. 16 shows the expected distribution of oxygen (O) and silicon (Si) in the SiCuO$_x$ layer 20 on the copper thin film. Specifically, FIG. 16(*a*) is a side view showing that oxygen (O) and silicon (Si) form the SiCuO$_x$ layer 20 on the copper thin film, and FIG. 16(*b*) is a top view. The silicon (Si) is expected to bond with oxygen (O) on the copper surface and function to fix oxygen onto the copper surface. In this case, the most basic structure is as shown in FIG. 16. As shown in the side view of FIG. 16(*a*) and the top view of FIG. 16(*b*), when the oxygen (O) covers the copper surface and is then fixed by silicon (Si), it may function to prevent other oxygen (O) atoms from entering the inside of the copper.

The present invention also provides a semiconductor device including a silicon-coated copper produced by the method for producing a silicon-coated copper. This semiconductor device may include a copper on which a silicon (Si)-oxygen (O)-copper (Cu) mixed layer has been formed by depositing silicon (Si). Details regarding the copper in the semiconductor device are as described above with respect to the silicon-coated copper.

Specifically, the semiconductor device is connected to a semiconductor chip pad and a terminal and includes the oxidation-resistant copper of the present invention, which has the silicon (Si)-oxygen (O)-copper (Cu) mixed layer formed on the surface thereof. Thus, compared to the case in which gold is used, the copper in the semiconductor device of the present invention has low electrical resistance and high firmness, is less expensive, has increased resistance even to high surrounding temperatures, and may be used for a long time. In addition, the silicon-coated copper in the semiconductor device retains the advantages of general copper, and at the same time, has improved electrical properties and increased strength due to inhibition of oxidation.

More specifically, the first silicon (Si)-oxygen (O) mixed layer 30, the silicon (Si) layer 40, and the second silicon (Si)-oxygen (O) mixed layer 50, which are layers formed by coating copper with silicon (Si), may have a thickness of 5 to 30 nm. If these silicon (Si)-coated layers are thinner than 5 nm, a problem may arise in that the copper is easily oxidized, and if these layers are thicker than 30 nm, a problem may arise in that the copper becomes dielectric or has poor electrical conductivity. For this reason, these layers have a thickness within the above-described range.

In addition, in the semiconductor device, the SiCuO$_x$ layer may have a thickness of 0.8 to 1.2 nm.

According to the above-described technical solution of the present invention, it is possible to produce a copper free from oxidation with high efficiency simply by deposition of silicon (Si), and it is possible to replace gold with copper (Cu) and silicon (Si), which are the most abundant on earth. Therefore, the present invention is economically highly valuable.

In addition, according to the present invention, it is possible to produce a silicon-coated copper (Cu), which has resistance to oxidation while retaining the electrical properties of copper, by forming a silicon (Si)-oxygen (O)-copper (Cu) mixed layer through deposition of silicon (Si).

In addition, according to the present invention, it is possible to provide an oxidation-resistant copper, which lasts the longest at high temperatures, is produced in a very simple manner, is inexpensive, and may be used semi-permanently at room temperature.

In addition, when pattern fabrication and surface treatment are performed according to the present invention, it is possible to fabricate a circuit that does not oxidize despite heat generation, thereby preventing fire and explosion from occurring due to heat generation. Moreover, the copper of the present invention may greatly enhance current density and may create a very great sensation in semiconductor processes.

The above description of the present invention is exemplary, and it will be understood by those skilled in the art to which the present invention pertains that the present invention may be embodied in other specific forms without departing from the technical spirit or essential characteristics of the present invention.

Therefore, the embodiments described above should be considered to be illustrative in all respects and not restrictive. Furthermore, the scope of the present invention is defined by the appended claims rather than the detailed description, and it should be understood that all modifications or variations derived from the meanings and scope of the appended claims and equivalents thereto are included within the scope of the present invention.

DESCRIPTION OF REFERENCE NUMERALS

10. Copper layer
20. SiCuO$_x$ layer
30. First silicon (Si)-oxygen (O) mixed layer
40. Silicon (Si) layer
50. Second silicon (Si)-oxygen (O) mixed layer

The invention claimed is:

1. A silicon-coated oxidation-resistant copper comprising:
a copper layer;
a SiCuO$_x$ layer consisting of a silicon (Si)-oxygen (O)-copper (Cu) mixed layer formed on the copper layer by depositing silicon (Si);
a first silicon (Si)-oxygen (O) mixed layer (30) formed on the SiCuO$_x$ layer;
a silicon (Si) layer formed on the first silicon (Si)-oxygen (O) mixed layer; and
a second silicon (Si)-oxygen (O) mixed layer (50) formed on the silicon layer (Si) layer.

2. The silicon-coated oxidation-resistant copper according to claim 1, which has an electrical resistivity between that of non-silicon-coated copper and that of gold (Au).

3. The silicon-coated oxidation-resistant copper according to claim 1, which is a single-crystal thin film, a polycrystalline thin film, a foil, or a bulk.

4. The silicon-coated oxidation-resistant copper according to claim 3, which is the single-crystal thin film and is prevented from oxidation even when heated at 400° C. for 30 minutes.

5. The silicon-coated oxidation-resistant copper according to claim 3, which is the polycrystalline thin film, the foil, or the bulk and is prevented from oxidation even when heated to 300° C.

6. The silicon-coated oxidation-resistant copper according to claim 1, which is prevented from oxidation even when heated at 200° C. for 60 hours.

7. The silicon-coated oxidation-resistant copper according to claim 1, which has an electrical resistivity of $1.68*10^{-6}$ to $2.2*10^{-6}$ $\Omega$·cm.

8. The silicon-coated oxidation-resistant copper according to claim 1, wherein the first silicon (Si)-oxygen (O) mixed layer, the silicon (Si) layer, and the second silicon (Si)-oxygen (O) mixed layer have a thickness of 5 to 30 nm.

9. The silicon-coated oxidation-resistant copper according to claim 1, wherein the first silicon (Si)-oxygen (O) mixed layer and the second silicon (Si)-oxygen (O) mixed layer have a thickness of 1 to 10 nm.

10. The silicon-coated oxidation-resistant copper according to claim 1, wherein the SiCuO$_x$ layer has a thickness of 0.8 to 1.2 nm.

* * * * *